United States Patent [19]
Uchikawa et al.

[11] Patent Number: 5,908,720
[45] Date of Patent: *Jun. 1, 1999

[54] PHOTOSENSITIVE RESIN COMPOSITION FOR FORMING LIGHT SHIELDING FILMS, BLACK MATRIX FORMED BY THE SAME, AND METHOD FOR THE PRODUCTION THEREOF

[75] Inventors: Kiyoshi Uchikawa, Koza; Masaru Shida, Sagamihara; Junichi Onodera, Fujisawa; Hiroshi Komano, Koza, all of Japan

[73] Assignee: Tokyo Ohka Kogyo Co., Ltd., Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/730,317

[22] Filed: Oct. 11, 1996

[30] Foreign Application Priority Data

Oct. 13, 1995 [JP] Japan ................................ 7-291909

[51] Int. Cl.$^6$ ........................................... G03F 9/00
[52] U.S. Cl. ............................. 430/6; 430/20; 430/270.1
[58] Field of Search ................... 430/6, 20, 270.1

[56] References Cited

U.S. PATENT DOCUMENTS 5,095,379  3/1992  Fukunaga et al. ................... 359/68
5,248,576  9/1993  Yokoyama et al. ..................... 430/7
5,368,991  11/1994  Uchikawa et al. .................... 430/288

FOREIGN PATENT DOCUMENTS 6-35188  2/1994  Japan .
8-82928  3/1996  Japan .

Primary Examiner—Christopher G. Young
Attorney, Agent, or Firm—Finnegan, Henderson, Farabow, Garrett & Dunner, L.L.P.

[57] ABSTRACT

A photosensitive resin composition for forming light shielding films comprising a mixture of; 10 to 60 parts by weight of a high molecular weight polymeric binder; 15 to 50 parts by weight of a photopolymerizable monomer; 0.1 to 30 parts by weight of a photopolymerization initiator; and at least 20 parts by weight of a light shielding pigment comprising carbon black coated with resin for forming black matrices such as CRT displays and liquid crystal panels; a black matrix made from by said photosensitive resin composition; and a method for producing said black matrix comprising the steps of coating said photosensitive resin composition comprising a high molecular weight polymeric binder, a photopolymerizable monomer, a photopolymerization initiator, and a light shielding pigment consisting of carbon black coated with resin on a substrate, selectively radiating an activated beam, and developing the coating using an alkaline aqueous solution to form a pattern. The blackmatrix maintains high image contrast, and excels in electric insulation.

10 Claims, 1 Drawing Sheet

PHOTOSENSITIVE RESIN COMPOSITION FOR FORMING LIGHT SHIELDING FILMS, BLACK MATRIX FORMED BY THE SAME, AND METHOD FOR THE PRODUCTION THEREOF

FIELD OF THE INVENTION

The present invention relates to a photosensitive resin composition for forming light shielding films, a black matrix formed by said photosensitive resin composition, and a method for the production thereof, and more specifically to a photosensitive resin composition for forming light shielding films excellent in electrical insulation suitable for forming black matrices such as a liquid crystal panel and plasma display panels, a black matrix formed by said photosensitive resin composition, and a method for the production thereof.

BACKGROUND OF THE INVENTION

A liquid crystal panel, particularly a liquid crystal panel of the TN systems and the STN systems has a structure in which a black matrix is provided on a glass substrate for emphasizing the contrast of images, on which a transparent protective film, a transparent electrode, an orientation film, liquid crystals, a transparent electrode, a transparent protective film, a back light and the like are sequentially laminated, and sealing portions for maintaining the air tightness of the edges of said members. In color liquid crystal panel, color filters are also provided. In order that such a liquid crystal display panel maintains the contrast of images high, the light shielding capacity of the black matrix must be an optical density value (hereafter simply referred to as OD value) of 1.5 or more. Moreover, due to the problems of color filters and planarizing of transparent protective films, the black matrix must be as thin as possible. The black matrix is produced by photolithography after dissolving a photosensitive resin composition for forming a light shielding film containing a light shielding pigment and a photosensitive resin in a solvent, coating the solution on the surface of a liquid crystal panel substrate, and drying the coating. It is essential for obtaining a black matrix of a high OD value, that a highly light-shielding pigment is used, and carbon black having a high light shielding capacity is normally used.

In a simple matrix liquid crystal display panel such as that of the STN system having conventional black matrix described above, or a TFT-on-array display, voltage between transparent electrodes holding liquid crystals must be constant to keep images displayed even. However, since carbon black is conductive and electric current leaks from the transparent electrodes to the black matrix, the voltage is difficult to be constant, and time for operation using a battery cannot be increased. In addition, from the structural nature of the liquid crystal display panel, electric current easily leaks from the sealing portion of the panel, which makes more difficult to make the voltage constant. In order to solve such problems, photosensitive resin compositions for forming shielding films containing inorganic pigments such as titanium black, or organic pigments such as perylene black have been proposed, but it has been difficult to achieve high OD values, and black matrix layers must be thickened for obtaining high contrast. This results in disadvantages in that the planarization of color filters and transparent protective films is difficult, and images displayed become uneven.

In these situations, we, the present inventors have assiduously studied so as to develope a photosensitive resin composition for forming light shielding films and, as a result, have found that the above problems were solved by incorporating carbon black coated with resin in the photosensitive resin composition for forming light shielding films. On the basis of these findings, we have completed the present invention.

SUMMARY OF THE INVENTION

It is an object of the present invention to provide a photosensitive resin composition for forming light shielding films used for producing a black matrix having a high OD value, and still free of current leakage.

It is another object of the present invention to provide a black matrix produced by using said photosensitive resin composition for forming light shielding films.

It is a further object of the present invention to provide a method for producing said black matrix.

Since the black matrix is produced by using said photosensitive resin composition which contains carbon black coated with a resin to interfere with its conductivity, the black matrix excels in electric insulation and maintains the contrast of images high, and is useful for various display devices such as liquid crystal display panels and plasma display panels.

The other objects of the present invention will be obvious from the following description and drawings, and from attached claims. A number of advantages not described herein will be found by those skilled in the art.

DETAILED DESCRIPTION OF THE INVENTION

Figure 1:
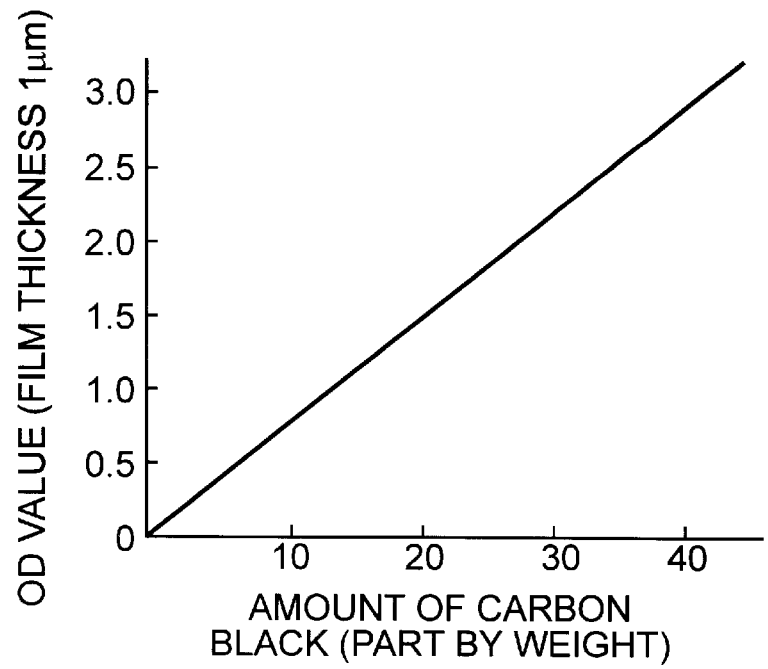
FIG. 1 is a graph showing relationship between the amounts of carbon black and OD values.

The photosensitive resin composition of the present invention comprises a mixture of (a) 10 to 60 parts by weight of a high molecular weight polymeric binder, (b) 15 to 50 parts by weight of a photopolymerizable monomer, (c) 0.1 to 30 parts by weight of a photopolymerization initiator, and (d) at least 20 parts by weight of a light shielding pigment. As a high molecular weight polymeric binder of the component (a), binders which can be developed using alkaline developers because of the ease of developing can be preferably used in the present invention. Such binders include copolymers from monomers having carboxyl groups, such as acrylic acid and methacrylic acid and monomers selected from the group of comprising methyl acrylate, methyl methacrylate, ethylacrylate, ethyl methacrylate, 2-hydroxyethyl acrylate, 2-hydroxyethyl methacrylate, 2-hydroxypropyl methacrylate, N-butyl acrylate, N-butyl methacrylate, isobutyl acrylate, isobutyl methacrylate, benzyl acrylate, benzyl methacrylate, phenoxy acrylate, phenoxy methacrylate, isobornyl acrylate, isobornyl methacrylate, glycidyl methacrylate, styrene, acrylamide and acrylonitrile; phenol novolak type epoxyacrylate polymers; phenol novolak type epoxy methacrylate polymers; cresol novolak type epoxy acrylate polymers; cresol novolak type epoxy methacrylate polymers; bisphenol A type epoxy acrylate polymers; and bisphenol S type epoxyacrylate polymers. Because acryloyl groups or methacryloyl groups are intoroduced in these polymers the above polymers have high crosslinking efficiency, and excel in the light resistance and chemical resistance of the formed films. The content of the monomer component having carboxyl groups, such as acrylic acid and methacrylic acid constituting such resins, is preferably within the range between 5 and 40 percent by weight.

The content of the component (a) is preferably 10 to 60 parts by weight relative to 100 parts by weight of the total of components (a) through (d). If the content of the component (a) is less than 10 parts by weight, it is difficult to form a film on coating and drying, and the strength of the film after curing cannot be increased sufficiently. If the content exceeds 60 parts by weight, developing becomes difficult.

Photopolymerizable monomers of the components (b) include, but are not limited to, methyl acrylate, methylmethacrylate, 2-hydroxyethyl acrylate, 2-hydroxyethylmethacrylate, 2-hydroxypropyl methacrylate, ethylene glycol diacrylate, ethylene glycol dimethacrylate, triethylene glycol diacrylate, triethylene glycol dimethacrylate, tetraethylene glycol diacrylate, tetraethylene glycol dimethacrylate, propylene glycol diacrylate, propylene glycol dimethacrylate, trimethylol propane triacrylate, trimethylol propane trimethacrylate, tetramethylol propane tetraacrylate, tetramethylol propane tetramethacrylate, pentaerythritol triacrylate, pentaerythritol trimethacrylate, pentaerythritol tetraacrylate, pentaerythritol tetramethacrylate, dipentaerythritol pentaacrylate, dipentaerythritol pentamethacrylate, dipentaerythritol hexaacrylate, dipentaerythritol hexamethacrylate, 1,6-hexanediol diacrylate, benzylacrylate, benzyl methacrylate, cardoepoxy diacrylate, acrylic acid, and methacrylic acid.

The content of the component (b) is preferably 15 to 50 parts by weight relative to 100 parts by weight of the total of components (a) through (d). If the content of the component (b) is less than 15 parts by weight, photocuring becomes insufficient, and high heat resistance and high chemical resistance cannot be achieved. If the content of the component (b) exceeds 50 parts by weight, film formation becomes poor.

Photopolymerization initiators of the component (c) are 1-hydroxycyclohexylphenyl ketone, 2,2-dimethoxy-1,2-diphenyl ethane-1-one, 2-methyl-1-(4-(methylthio)phenyl)-2-morphorino propane-1-one, 2-benzyl-2-dimethylamino-1-(4-morphorinophenyl)-butane-1-one, 2-hydroxy-2-methyl-1-phenyl propane-1-one, 2,4,6-trimethylbenzoyl diphenyl phosphine oxide, 1-1-[4-(2-hydroxyethoxy)phenyl]-2-hydroxy-2-methyl-1-propane-1-one, 2,4-diethylthioxanthone, 2-chlorothioxanthone, 2-4-dimethylthioxanthone, 3,3-dimethyl-4-methoxybenzophenone, benzophenone, 1-chloro-4-propoxythioxanthone, 1-(4-isopropylphenyl)-2-hydroxy-2-methyl propane -1-one, 1-(4-dodecylphenyl)-2-hydroxy-2-methylpropane-1-one, 4-benzoyl-4'-methyl dimethyl sulfide, 4-dimethylamino benzoic acid, methyl 4-dimethylamino benzoate, ethyl 4-dimethylamino benzoate, butyl 4-dimethylaminobenzoate, 4-dimethylamino-2-ethyl hexyl benzoic acid, 4-dimethylamino-2-isoamyl benzoic acid, 2,2-diethoxyacetophenone, benzyl dimethyl ketal, benzyl methoxyethylacetal, 1-phenyl-1,2-propanedione-2-(o-ethoxy carbonyl) oxim, methyl o-benzoyl benzoate, bis (4-dimethylaminophenyl)ketone, 4,4'-bisethylamino benzophenone, 4,4'-dichlorobenzophenone, benzyl, benzoin, benzoin methyl ether, benzoin ethyl ether, benzoin isopropyl ether, benzoin n-butyl ether, benzoin isobutyl ether, benzoin butyl ether, p-dimethylamono acetophenone, p-tert-butyl trichloroacetophenone, p-tert-butyl dichloroacetophenone, thioxanthone, 2-methyl thioxanthone, 2-isopropylthioxanthone, dibenzosuberone, dichloro-4-phenoxyacetophenone, pentyl-4-dimethylamino benzoate, 9-phenylacridine, 1,7-bis-(9-acridinyl) heptane, 1,5-bis-(9-acridinyl) pentane, 1,3-bis-(9-acridinyl) propane, 2,4-bis-trichloromethyl-6-(3-bromo-4-methoxy)phenyl-s-triazine, 2,4-bis-trichloromethyl-6-(2-bromo-4-methoxy) phenyl-s-triazine, 2,4-bis-trichloromethyl-6-(3-bromo-4-methoxy)styrylphenyl-s-triazine, and 2,4-bis-trichloromethyl-6-(2-bromo-4-methoxy) styrylphenyl-s-triazine.

The content of the component (c) may be within the range from 0.1 to 30 parts by weight relative to 100 parts by weight of the total of components (a) through (d).

The light shielding pigment of the component (d) contained in the photosensitive resin composition for forming light shielding films of the present invention is carbon black coated with resin. The carbon black coated with resin is produced by a coating process comprising mixing carbon black and resins which have reactivity with carboxy, hydroxyl, or carbonyl groups on the surface of the carbon black and heating them at 50–380° C., by a coating process comprising dispersing carbon black and monomers which contain radical polymerizable or radical copolymerizable ethlyenically unsaturated groups capable of reacting with said residual groups in a mixture of water and an organic solvent or a mixture of water and a surface active agent, and polymerizing them in the presence of a polymerization initiator, or by a process for coating carbon black with melamine resin, alkyd resin, acrylic resin, epoxy resin, urethane resin, polyvinylchloride resin, polystyrene resin, acrylic nitrile-butadiene-styrene resin and the like using such method as CVD method, PVD method and the like. Although the carbon black may be carbon black manufactured by various known methods, channel black, furnace black, thermal black, and lamp black are preferred, among which channel black and furnace black are more preferred. Especially, high color channel black is most preferred because it excels in light shielding properties and resin coating properties. Resins for coating the carbon black include those from one or more monomers having groups which have reactivity with carboxyl, hydroxyl, or carbonyl groups present on the surface of the carbon black, such as epoxy, thioepoxy, oxazoline, azilidine, or hydroxyalkyl amide groups as the polymerizable component. Among these, the resin obtained from monomers of which reactive groups are epoxy or thioepoxy groups is preferred because of a high reactivity with the surface of carbon black. Monomers having the above reactive groups include the following compounds from (1) to (19):

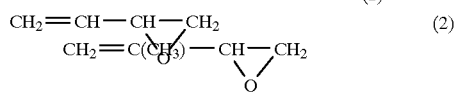

(1)

(2)

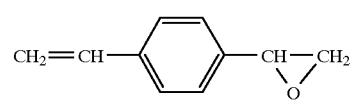

(3)

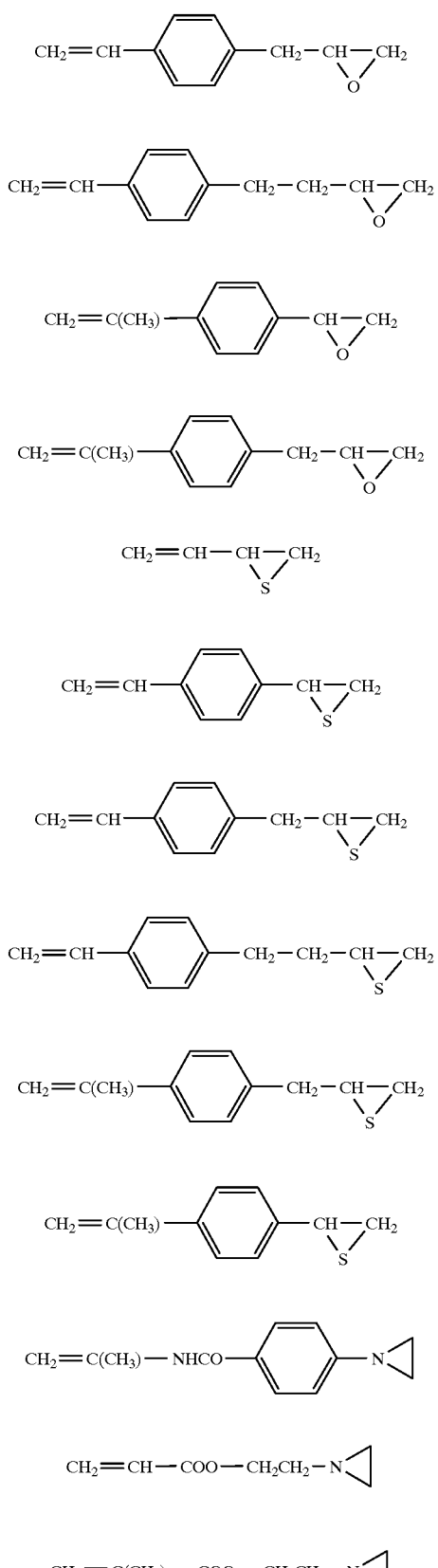

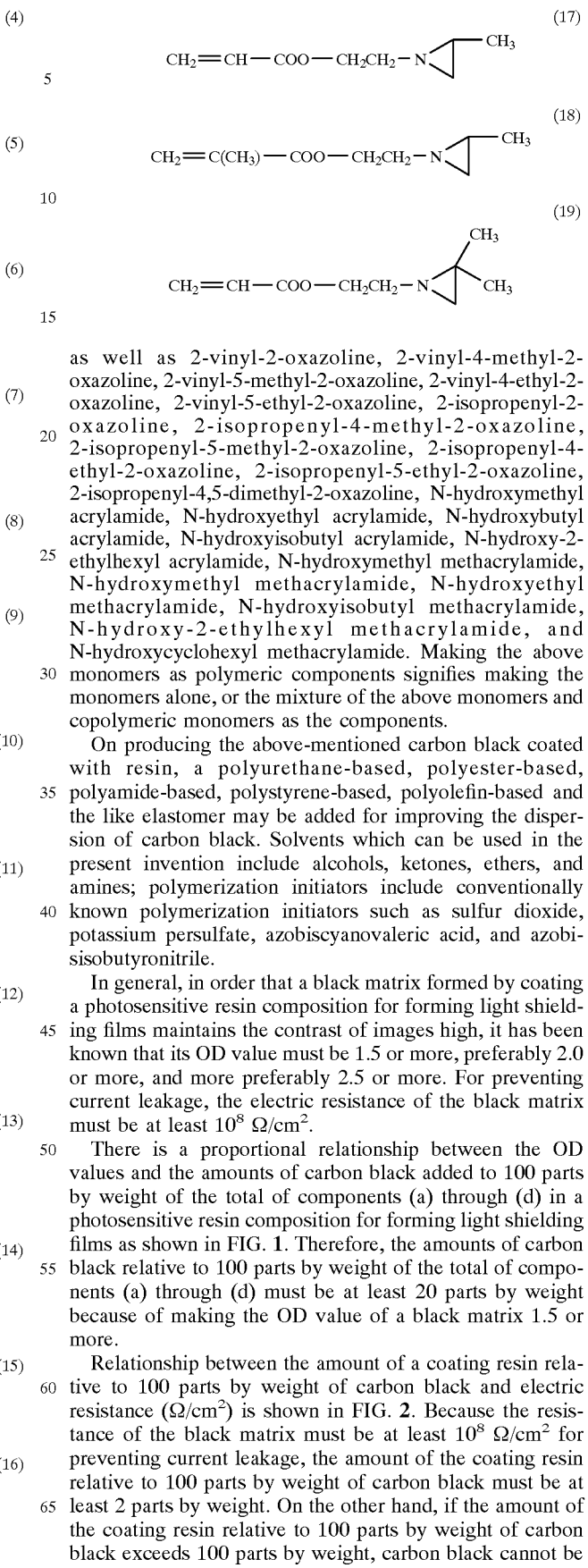

as well as 2-vinyl-2-oxazoline, 2-vinyl-4-methyl-2-oxazoline, 2-vinyl-5-methyl-2-oxazoline, 2-vinyl-4-ethyl-2-oxazoline, 2-vinyl-5-ethyl-2-oxazoline, 2-isopropenyl-2-oxazoline, 2-isopropenyl-4-methyl-2-oxazoline, 2-isopropenyl-5-methyl-2-oxazoline, 2-isopropenyl-4-ethyl-2-oxazoline, 2-isopropenyl-5-ethyl-2-oxazoline, 2-isopropenyl-4,5-dimethyl-2-oxazoline, N-hydroxymethyl acrylamide, N-hydroxyethyl acrylamide, N-hydroxybutyl acrylamide, N-hydroxyisobutyl acrylamide, N-hydroxy-2-ethylhexyl acrylamide, N-hydroxymethyl methacrylamide, N-hydroxymethyl methacrylamide, N-hydroxyethyl methacrylamide, N-hydroxyisobutyl methacrylamide, N-hydroxy-2-ethylhexyl methacrylamide, and N-hydroxycyclohexyl methacrylamide. Making the above monomers as polymeric components signifies making the monomers alone, or the mixture of the above monomers and copolymeric monomers as the components.

On producing the above-mentioned carbon black coated with resin, a polyurethane-based, polyester-based, polyamide-based, polystyrene-based, polyolefin-based and the like elastomer may be added for improving the dispersion of carbon black. Solvents which can be used in the present invention include alcohols, ketones, ethers, and amines; polymerization initiators include conventionally known polymerization initiators such as sulfur dioxide, potassium persulfate, azobiscyanovaleric acid, and azobisisobutyronitrile.

In general, in order that a black matrix formed by coating a photosensitive resin composition for forming light shielding films maintains the contrast of images high, it has been known that its OD value must be 1.5 or more, preferably 2.0 or more, and more preferably 2.5 or more. For preventing current leakage, the electric resistance of the black matrix must be at least $10^8$ $\Omega/cm^2$.

There is a proportional relationship between the OD values and the amounts of carbon black added to 100 parts by weight of the total of components (a) through (d) in a photosensitive resin composition for forming light shielding films as shown in FIG. 1. Therefore, the amounts of carbon black relative to 100 parts by weight of the total of components (a) through (d) must be at least 20 parts by weight because of making the OD value of a black matrix 1.5 or more.

Figure 2:
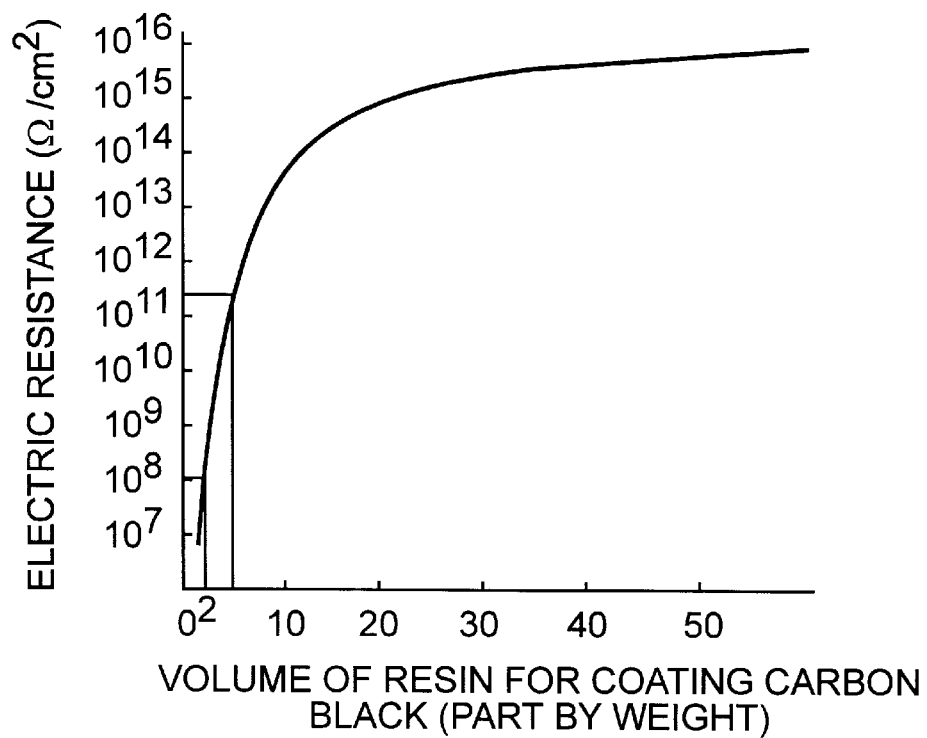
FIG. 2 is a graph showing relationship between the amounts of the resin used for coating carbon black and electric resistance.

Relationship between the amount of a coating resin relative to 100 parts by weight of carbon black and electric resistance ($\Omega/cm^2$) is shown in FIG. 2. Because the resistance of the black matrix must be at least $10^8$ $\Omega/cm^2$ for preventing current leakage, the amount of the coating resin relative to 100 parts by weight of carbon black must be at least 2 parts by weight. On the other hand, if the amount of the coating resin relative to 100 parts by weight of carbon black exceeds 100 parts by weight, carbon black cannot be dispersed evenly, the amount of the coating resin pigment must not exceed the above range. That is, the weight ratio of carbon black to the coating resin should be 50:1 to 1:1. In particular, when the dispersion of carbon black is taken into account, the above ratio should be within a range between 30:1 and 2:1, preferably 20:1 and 3:1.

In the photosensitive resin composition for forming light shielding films of the present invention, other pigments can be added, in addition to carbon black coated with resin, for adjusting color tone and for achieving high erelectric resistance within a range not lowering the shielding capacity. Suitable pigments have the following color index (C.I.) numbers:

Yellow pigments: C.I. 20, 24, 83, 86, 93, 109, 110, 117, 125, 137, 138, 139, 147, 148, 153, 154 166, 168

Orange pigments: C.I. 36, 43, 51, 55, 59, 61

Red pigments: C.I. 9, 97, 122, 123, 149, 168, 177, 180 192, 215, 216, or 217, 220, 223, 224 226, 227, 228, 240

Purple pigments: C.I. 19, 23, 29, 30, 37, 40, 50

Blue pigments: C.I. 15, 16, 22, 60, 64

Green pigments: C.I. 7, 36

Brown pigments: C.I. 23, 25, 26

The amount of the pigment added to the above-mentioned photosensitive resin composition including the component (d) is 20 to 150 parts by weight, preferably 25 to 100 parts by weight, and more preferably 30 to 80 parts by weight relative to 100 parts by weight of the total of components (a) through (c). If the amount of the pigment is less than 20 parts by weight, sufficient light shielding capacity is not imparted to the black matrix, and if the amount exceeds 150 parts by weight, the amount of the photosensitive resin component decreases causing insufficient curing, and a good black matrix cannot be obtained.

In addition to the above, organic additives may be compounded in the photosensitive resin composition of the present invention for improving coating properties and for adjusting viscosity. The above organic additives include benzene, toluene, xylene, methylethyl ketone, acetone, methylisobutylketone, cyclohexanone, methanol, ethanol, propanol, butanol, hexanol cyclohexanol, ethylene glycol, diethylene glycol, glycerin, ethylene glycol monomethyl ether, ethylene glycol monoethyl ether, propylene glycol monomethyl ether, propylene glycol monoethyl ether, diethylene glycol monomethyl ether diethylene glycol monoethyl ether, diethylene glycol dimethyl ether, diethylene glycol diethylether, 3-methoxybutyl acetate, 3-methyl-3-methoxybutylacetate, propylene glycol monomethyl ether propionate, propylene glycol monoethyl ether propionate, methylcarbonate, ethyl carbonate, propyl carbonate, and butylcarbonate. Among them, more preferred is 3-methoxybutyl acetate because it not only exhibits a high solubility of insoluble components in the photosensitive resin composition, but also accelerates the dispersion of insoluble components such as pigments. The amount of the above-mentioned organic additives may be 50 to 500 parts by weight relative to 100 parts by weight of total of a high molecular weight polymeric binder, the photopolymerizable monomer, the photopolymerization initiator, and the light shielding pigment.

The methods for using the photosensitive resin composition for forming light shielding films of the present invention will be described below.

(i) Preparation of Photosensitive Resin Composition

The high molecular weight polymeric binder the photopolymerizable monomer, the photopolymerization initiator, the light shielding pigment, and when required, organic additives are nixed, and dispersed and kneaded by a three-roller mill, ball mill, or sand mill to prepare a photosensitive resin composition for forming light shielding films.

(ii) Coating of Photosensitive Resin Composition

The thus prepared photosensitive resin composition is coated on a glass substrate such as soda lime glass, low expansion glass, non-alkali glass, and quartz glass, or a glass substrate on which ITO electrodes have been formed having a cleaned surface using a contact transfer type coating machine such as a roll coater, reverse coater, and bar coater, or a non-contact transfer type coating machine such as a spinner and a curtain flow coater.

In the above-mentioned preparation and coating processes, a silane coupling agent may be compounded in the photosensitive resin composition, or coated on the above substrate for promoting the adhesion of the glass substrate and the photosensitive resin composition.

(iii) Manufacture of Black Matrix

After the above-mentioned coating process, the solvent is removed by allowing the coated substrate to stand for several hours to several days at room temperature, or by drying in a warm air circulating dryer or an infrared heater for several tens minutes to several hours, and the film thickness is adjusted within a range between 0.5 to 5 $\mu$m. The substrate is then exposed to an activated energy beam such as ultraviolet rays and excimer laser beam at an irradiation energy dose of 100 to 2000 mJ/cm$^2$ through a negative mask. The above irradiation energy dose may be changed depending on the type of the photosensitive resin composition used. The light shielding film obtained by exposing is developed by dipping in, or spraying a developer to form a black matrix pattern. The developers used in the present invention are hydroxides, carbonates, bicarbonates, phosphates, and pyrophosphates of alkali metals such as lithium, sodium, and potassium; primary amines such as benzyl amine and butyl amine: secondary amines such as dimethyl amine, dibenzyl amine, and diethanol amine; tertiary amines such as trimethyl amine, triethyl amine, and triethanol amine; aromatic amines such as morpholine, piperazine, and pyridine; polyamines such as ethylenediamine and hexamethylene diamine, ammonium hydroxides such as tetraethyl ammonium hydroxide, trimethylbenzyl ammoniumhydroxide, and trimethylphenylbenzyl ammonium hydroxide; sulfonium hydroxides such as trimethylsulfonium hydroxide, diethylmethylsulfonium hydroxide, and dimethylbenzylsulfonium hydroxide; and the alkaline aqueous solutions of choline and the like.

Although the preferred embodiments of the present invention will be described below, the present invention is not limited to these embodiments.

EXAMPLE 1

The following components are dispersed and kneaded using a three-roller mill for 2 hours.

| | |
|---|---|
| Methacrylic acid/methyl methacrylate copolymer (25/75% by wt, weight-average molecular weight: about 20,000) | 30 parts by wt |
| Bisphenol A type epoxy acrylate resin (weight-average molecular weight: about 3,000) | 20 parts by wt |
| Trimethylolpropane triacrylate | 20 parts by wt |
| 2-methyl-1-[4-(methylthio) phenyl]-2-morphorinopropane-1-one (Ciba Geigy, IRGACURE 907) | 9 parts by wt |
| 9-phenyl acrydine | 5 parts by wt |
| 4,4'-bisdiethylamino benzophenone | 4 parts by wt |

-continued

| Carbon black coated with resin (Mikuni Shikiso EX-1455-90, carbon black:coating resin = 10:1.1) | 40 parts by wt |
| --- | --- |
| Fastgen Blue GS (Dainippon Ink & Chemicals) | 5 parts by wt |
| 3-methoxybutyl acetate | 150 parts by wt |

The above-prepared photosensitive resin composition was coated on a glass substrate of a thickness of 0.5 mm using a reverse coater (Dainippon Screen, Round Coater) to a dry film thickness of 1 μm, and dried at 80° C. for 1 minute. The entire surface of the coated substrate was then exposed to an ultraviolet ray of 1000 mJ/cm$^2$, and was post-baked at 250 for 30 minutes. The OD value of this substrate was 2.5, and the resistivity was $5.2 \times 10^{13}$ Ω/cm$^2$. The light shielding film formed on the substrate was excellent without pinholes and color unevenness.

Next, the glass substrate of a thickness of 0.7 mm coated with the above photosensitive resin composition to have a dry thickness of 1 μm was exposed to an ultraviolet ray of a dose of 1000 mJ/cm$^2$ through a mask for reproducing a 20 μm line/80 μm space, and post-baked at 250° C. for 30 minutes. The exposed substrate was spray developed using a 0.5% aqueous solution of sodium carbonate at 25° C. for 60 seconds. The exposed area has no breaking or peeling, and a good black matrix pattern without residue was obtained even in the unexposed area. This black matrix was used for forming a liquid crystal display panel, which reproduced uniform images without current leakage.

EXAMPLE 2

A light shielding film was formed in the same manner as in Example 1 except that 40 parts by weight of carbon black coated with resin (Mikuni Shikiso EX-1455-70, carbon black:coating resin=70:30) in place of 40 parts by weight of carbon black coated with resin (Mikuni Shikiso EX-1455-90) used in Example 1. Its OD value was 2.3, and the resistivity was $5.1 \times 10^{13}$ Ω/cm$^2$. The thus formed light shielding film on the substrate was excellent without pinholes and color unevenness. This black matrix was used for forming a liquid crystal display panel, which reproduced uniform images without current leakage.

EXAMPLE 3

A light shielding film was formed in the same manner as in Example 1 except that 40 parts by weight of carbon black coated with resin (Mikuni Shikiso EX-1455-96, carbon black:coating resin=96:4) in place of 40 parts by weight of carbon black coated with resin (Mikuni Shikiso EX-1455-90) used in Example 1. Its OD value was 2.5, and the resistivity was $7.4 \times 10^9$ Ω/cm$^2$. The thus formed light shielding film on the substrate was excellent without pinholes and color unevenness. This black matrix was used for forming a liquid crystal display panel, which reproduced uniform images without current leakage.

EXAMPLE 4

A light shielding film was formed in the same manner as in Example 1 except that 40 parts by weight of resin coated carbon black (Mikuni Shikiso EX-1455-97, carbon black:coating resin=97:3) in place of 40 parts by weight of carbon black coated with resin (Mikuni Shikiso EX-1455-90) used in Example 1. Its OD value was 2.5, and the resistivity was $1.3 \times 10^9$ Ω/cm$^2$. The thus formed light shielding film on the substrate was excellent without pinholes and color unevenness. This black matrix was used for forming a liquid crystal display panel, which reproduced uniform images without current leakage.

EXAMPLE 5

A light shielding film was formed in the same manner as in Example 1 except that 40 parts by weight of carbon black coated with resin (Mikuni Shikiso EX-1455-60, carbon black:coating resin=60:40) in place of 40 parts by weight of carbon black coated with resin (Mikuni Shikiso EX-1455-90) used in Example 1. Its OD value was 1.9, and the resistivity was $3.3 \times 10^{15}$ Ω/cm$^2$. The thus formed light shielding film on the substrate was excellent without pinholes and color unevenness. This black matrix was used for forming a liquid crystal display panel, which reproduced uniform images without current leakage although the contrast of images was a little poor.

COMPARATIVE EXAMPLE 1

A light shielding film was formed in the same manner as in Example 1 except that 36 parts by weight of carbon black without resin coating (Mikuni Shikiso EX-719) in place of 40 parts by weight of carbon black coated with resin (Mikuni Shikiso EX-1455-90) used in Example 1. Its OD value was 2.5, and the resistivity was $4.8 \times 10^6$ Ω/cm$^2$. The light shielding film formed on the substrate had no pinholes and color unevenness. This black matrix was used for forming a liquid crystal display panel, but current leakage was observed and the brightness of images was uneven.

COMPARATIVE EXAMPLE 2

A light shielding film was formed in the same manner as in Example 1 except that 40 parts by weight of carbon black coated with resin (Mikuni Shikiso EX-1455-99, carbon black:coating resin=100:1) in place of 40 parts by weight of carbon black coated with resin (Mikuni Shikiso EX-1455-90) used in Example 1. Its OD value was 2.5, and the resistivity was $2.7 \times 10^7$ Ω/cm$^2$. The light shielding film formed on the substrate was excellent without pinholes and color unevenness. This black matrix was used for forming a liquid crystal display panel, but current leakage was observed and the brightness of images was uneven.

COMPARATIVE EXAMPLE 3

A light shielding film was formed in the same manner as in Example 1 except that 40 parts by weight of carbon black coated with resin (Mikuni Shikiso EX-1455-40, carbon black:coating resin=40:60) in place of 40 parts by weight of carbon black coated with resin (Mikuni Shikiso EX-1455-90) used in Example 1. Its OD value was 1.1, and the resistivity was $8.2 \times 10^{15}$ Ω/cm$^2$. The light shielding film formed on the substrate had no pinholes and color unevenness. This black matrix was used for forming a liquid crystal display panel, but the contrast of images was poor.

What is claimed is:

1. A photosensitive resin composition for forming light shielding films comprising a mixture of:

(a) 10 to 60 parts by weight of a high molecular weight polymeric binder;

(b) 15 to 50 parts by weight of a photopolymerizable monomer;

(c) 0.1 to 30 parts by weight of a photopolymerization initiator; and (d) at least 20 parts by weight of a light shielding pigment comprising carbon black coated with a resin obtained from one or more polymerizable monomers having at least one reactive group selected from the group consisting of epoxy, thioepoxy, oxazoline, azilidine and hydroxyalkyl amide groups.

2. The photosensitive resin composition for forming light shielding films as claimed in claim 1, wherein the weight ratio of carbon black to the coating resin is 50:1 to 1:1.

3. The photosensitive resin composition to form light shielding films as claimed in claim 1, wherein the weight ratio of carbon black to the coating resin is 30:1 to 2:1.

4. The photosensitive resin composition to form light shielding films as claimed in claim 1, wherein the weight ratio of carbon black to the coating resin is 20:1 to 3:1.

5. A black matrix made from a photosensitive resin composition for forming light shielding films which comprises effective amounts of: a high molecular weight polymeric binder, a photopolymerizable monomer, a photopolymerization initiator, and a light shielding pigment comprising carbon black coated with a resin obtained from one or more polymerizable monomers having at least one reactive group selected from the group consisting of epoxy, thioepoxy, oxazoline, azilidine and hydroxyalkyl amide groups.

6. The black matrix as claimed in claim 5, wherein the OD value of the black matrix is at least 1.5, and the resistivity thereof is at least $10^8$ $\Omega/cm^2$.

7. A method for producing a black matrix comprising the steps of:

(a) coating a substrate with a photosensitive resin composition for forming light shielding films comprising a mixture of effective amounts of: a high molecular weight polymeric binder, a photopolymerizable monomer, a photopolymerization initiator, and a light shielding pigment comprising carbon black coated with a resin obtained from one or more polymerizable monomers having at least one reactive group selected from the group consisting of epoxy, thioepoxy, oxazoline, azilidine and hydroxyalkyl amide groups;

(b) exposing the coated substrate to an activated energy beam through a mask; and (c) developing the resulting coating using an alkaline aqueous solution to form a pattern.

8. The method for producing a black matrix as claimed in claim 7, wherein the weight ratio of carbon black to the coating resin contained in the said photosensitive resin composition is 50:1 to 1:1.

9. The method for producing a black matrix as claimed in claim 7, wherein the weight ratio of carbon black to the coating resin contained in the said photosensitive resin composition is 30:1 to 2:1.

10. The method for producing a black matrix as claimed in claim 7, wherein the weight ratio of carbon black to the coating resin contained in the said photosensitive resin composition is 20:1 to 3:1.

* * * * *